(12) United States Patent
Song

(10) Patent No.: US 10,971,198 B2
(45) Date of Patent: Apr. 6, 2021

(54) SEMICONDUCTOR SYSTEM AND METHOD OF OPERATING THE SAME

(71) Applicant: SK hynix Inc., Icheon-si (KR)

(72) Inventor: Jun Yong Song, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/511,841

(22) Filed: Jul. 15, 2019

(65) Prior Publication Data

US 2020/0143852 A1 May 7, 2020

(30) Foreign Application Priority Data

Nov. 5, 2018 (KR) ........................ 10-2018-0134470

(51) Int. Cl.
*G11C 7/10* (2006.01)
*G11C 29/38* (2006.01)
*G11C 5/14* (2006.01)

(52) U.S. Cl.
CPC ............ *G11C 7/1051* (2013.01); *G11C 5/147* (2013.01); *G11C 7/1078* (2013.01); *G11C 29/38* (2013.01)

(58) Field of Classification Search
CPC ..... G11C 7/1051; G11C 5/147; G11C 7/1078; G11C 29/38

USPC .................................................... 365/189.09
See application file for complete search history.

(56) References Cited

U.S. PATENT DOCUMENTS

| 6,731,150 | B2 | 5/2004 | Huber | |
|---|---|---|---|---|
| 7,646,220 | B2 | 1/2010 | Wu | |
| 8,854,915 | B2 * | 10/2014 | Gillingham | ......... G06F 13/1694 365/233.1 |
| 2016/0224506 | A1 * | 8/2016 | Yoon | ...................... G06F 13/404 |
| 2019/0068145 | A1 * | 2/2019 | Lee | ...................... H03F 3/45659 |

* cited by examiner

*Primary Examiner* — Anthan Tran
(74) *Attorney, Agent, or Firm* — William Park & Associates Ltd.

(57) ABSTRACT

A semiconductor system may include a first semiconductor device and a second semiconductor device. The first semiconductor device compares a received signal with an original signal to generate a driving force control signal. The first semiconductor device also drives the original signal using a driving force in accordance with the driving force control signal to output an external transmission signal. The second semiconductor device receives the external transmission signal to generate a positive signal and a negative signal. The second semiconductor device also generates a restoration signal in response to the positive signal and the negative signal. The second semiconductor device additionally outputs the restoration signal as the external transmission signal to the first semiconductor device.

14 Claims, 8 Drawing Sheets

SEMICONDUCTOR SYSTEM AND METHOD OF OPERATING THE SAME

CROSS-REFERENCE TO RELATED APPLICATION

The present application claims priority under 35 U.S.C. § 119(a) to Korean application number 10-2018-0134470, filed on Nov. 5, 2018, in the Korean Intellectual Property Office, which is incorporated herein by reference in its entirety.

BACKGROUND

1. Technical Field

Various embodiments may generally relate to a semiconductor integrated circuit device, and more particularly, to a semiconductor system and a method of operating the semiconductor system.

2. Related Art

Semiconductor devices receive and transmit electrical signals. As semiconductor devices operate at increasingly faster speeds, accurately transmitting signals under conditions of low power consumption becomes more difficult.

SUMMARY

In accordance with the present disclosure, a semiconductor system may include a first semiconductor device and a second semiconductor device. The first semiconductor device may compare a received signal with an original signal to generate a driving force control signal. The first semiconductor device may drive the original signal using a driving force in accordance with the driving force control signal to output an external transmission signal. The second semiconductor device may receive the external transmission signal to generate a positive signal and a negative signal. The second semiconductor device may generate a restoration signal in response to the positive signal and the negative signal. The second semiconductor device may output the restoration signal as the external transmission signal to the first semiconductor device.

Also in accordance with the present disclosure, a semiconductor system may include a first semiconductor device and a second semiconductor device. The first semiconductor device may compare a received signal with an original signal to generate a preliminary gain control signal. The first semiconductor device may output the original signal as an external transmission signal. The first semiconductor device may output the preliminary gain control signal as a device control signal. The second semiconductor device may amplify the external transmission signal using a gain in accordance with the device control signal to generate a positive signal and a negative signal. The second semiconductor device may generate a restoration signal in response to the positive signal and the negative signal. The second semiconductor device may output the restoration signal as the external transmission signal to the first semiconductor device.

Further in accordance with the present disclosure, a method of operating a semiconductor system may include: test-setting a first semiconductor device and a second semiconductor device based on a test signal; driving an original signal by the first semiconductor device using an initial driving force; transmitting the driven original signal as an external transmission signal to the second semiconductor device; generating a restoration signal based on the external transmission signal transmitted to the second semiconductor device; transmitting the restoration signal as the external transmission signal to the first semiconductor device; comparing the original signal with the external transmission signal transmitted from the second semiconductor device to the first semiconductor device; changing the initial driving force; driving the original signal by the first semiconductor device using the changed driving force; and transmitting the driven original signal as the external transmission signal to the second semiconductor device.

Additionally in accordance with the present disclosure, a method of operating a semiconductor system may include: test-setting a first semiconductor device and a second semiconductor device based on a test signal; driving an original signal by the first semiconductor device using an initial driving force; transmitting the driven original signal as an external transmission signal to the second semiconductor device; generating a restoration signal based on the external transmission signal transmitted to the second semiconductor device and an initial gain value; transmitting the restoration signal as the external transmission signal to the first semiconductor device; comparing the original signal with the external transmission signal transmitted from the second semiconductor device to the first semiconductor device; changing the initial gain value force; generating the restoration signal based on the external transmission signal transmitted from the first semiconductor device and the changed gain value; and transmitting the generated restoration signal to the second semiconductor device.

BRIEF DESCRIPTION OF THE DRAWINGS

The above and other aspects, features, and advantages of the subject matter of the present disclosure will be more clearly understood from the following detailed description taken in conjunction with the accompanying drawings.

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present invention. However, embodiments of the present teachings should not be construed as limiting the novel concepts. Although a limited number of possible embodiments of the present teachings will be shown and described, it will be appreciated by those of ordinary skill in the art that changes may be made in these embodiments without departing from the principles and spirit of the present teachings.

Figure 1:
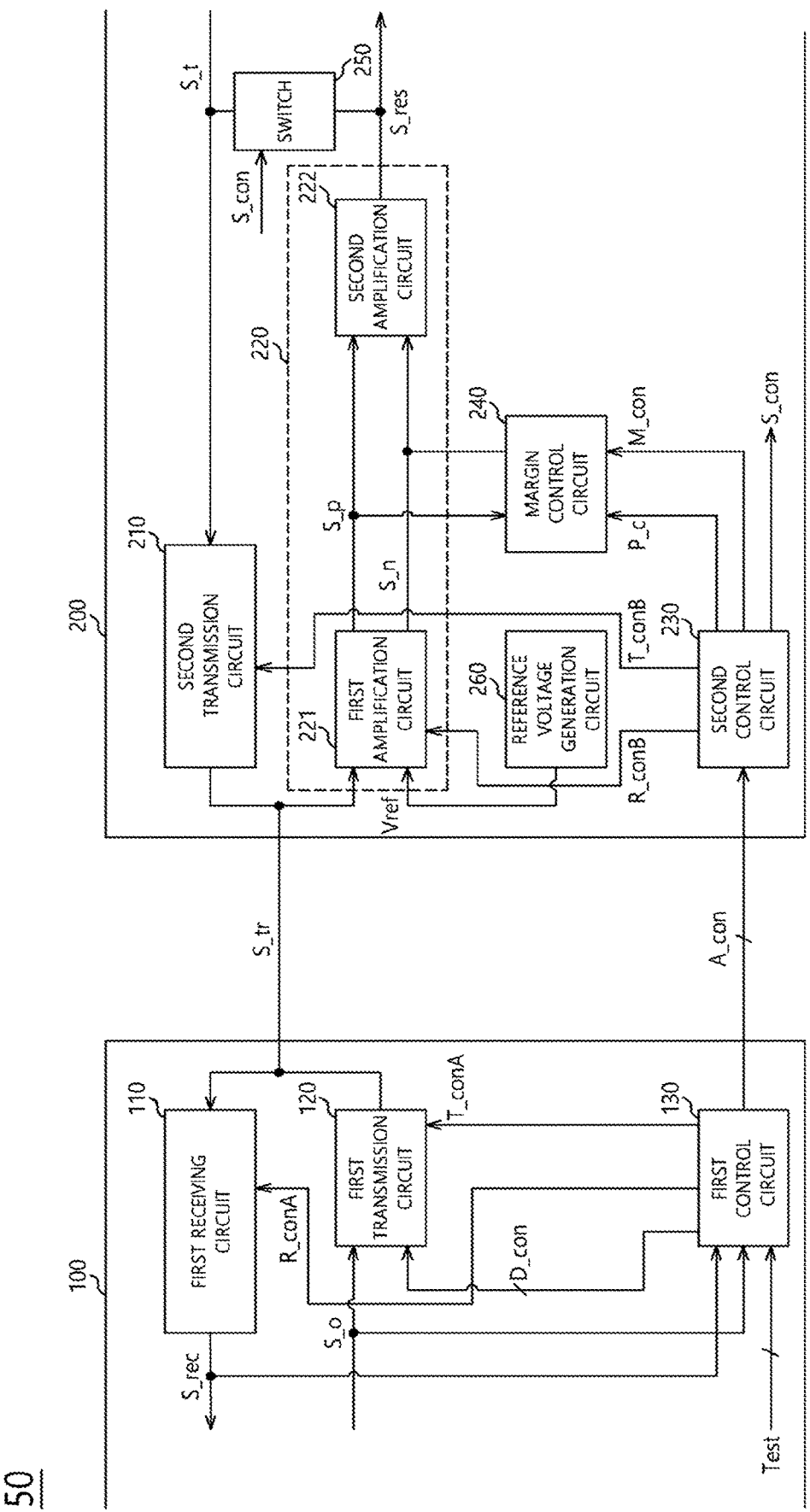
FIG. 1 is a block diagram illustrating a semiconductor system, in accordance with an embodiment of the present disclosure.

FIG. 1 is a block diagram illustrating a semiconductor system 50, in accordance with some embodiments.

Referring to FIG. 1, the semiconductor system 50 may include a first semiconductor device 100 and a second semiconductor device 200.

The first semiconductor device 100 and the second semiconductor device 200 may include electronic elements that communicate with each other. The first semiconductor device 100 may be a master device. The second semiconductor device 200 may be a slave device controlled and operated by the first semiconductor device 100. For example, the first semiconductor device 100 may include a host device, such as a processor. The processor may include a central processing unit (CPU), a graphic processing unit (GPU), a multi-media processor (MMP), a digital signal processor, etc. Alternatively, the first semiconductor device 100 may include a system-on-chip having processor chips with various functions, such as an application processor (AP).

The second semiconductor device 200 may include a memory. The memory may include a volatile memory and a non-volatile memory. The volatile memory may include a static RAM (SRAM), a dynamic RAM (DRAM), a synchronous DRAM (SDRAM), etc. The non-volatile memory may include a read only memory (ROM), a programmable ROM (PROM), an electrically erase and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), etc.

The first semiconductor device 100 may receive/transmit electrical signals S_tr from/to the second semiconductor device 200 based on a test signal Test. For example, the first semiconductor device 100 may transmit an external transmission signal S_tr to the second semiconductor device 200 based on the test signal Test. The first semiconductor device 100 may receive the external transmission signal S_tr from the second semiconductor device 200 based on the test signal Test.

The first semiconductor device 100 may include a first receiving circuit 110, a first transmission circuit 120, and a first control circuit 130.

The first receiving circuit 110 may receive a first receiving control signal R_conA and the external transmission signal S_tr to output a receiving signal S_rec. When the first receiving control signal R_conA is enabled, the first receiving circuit 110 may generate and output the receiving signal S_rec based on the external transmission signal S_tr. For example, when the first receiving control signal R_conA is enabled, the first receiving circuit 110 may be activated. The activated first receiving circuit 110 may generate and output the receiving signal S_rec based on the external transmission signal S_tr. When the first receiving control signal R_conA is disabled, the first receiving circuit 110 may be inactivated.

The first transmission circuit 120 may receive a first transmission control signal T_conA, a driving force control signal D_con, and an original signal S_o to output the external transmission signal S_tr. For example, when the first transmission control signal T_conA is enabled, the first transmission circuit 120 may be activated. In contrast, when the first transmission control signal T_conA is disabled, the first transmission circuit 120 may be inactivated. The first transmission circuit 120 may determine a driving force based on the driving force control signal D_con. When the first transmission control signal T_conA is enabled, the first transmission circuit 120 may drive the original signal S_o using the driving force determined by the driving force control signal D_con to output the external transmission signal S_tr.

The first control circuit 130 may receive the original signal S_o, the receiving signal S_rec, and the test signal Test to output the first transmission control signal T_conA, the first receiving control signal R_conA, the driving force control signal D_con, and a device control signal A_con. For example, the first control circuit 130 may enable and output any one of the first transmission control signal T_conA and the first receiving control signal R_conA based on the test signal Test. The first control circuit 130 may compare the original signal S_o with the receiving signal S_rec to output the driving force control signal D_con. The first control circuit 130 may output comparison information of the original signal S_o and the receiving signal S_rec, the first transmission control signal T_conA, the first receiving control signal R_conA, and the test signal Test as the device control signal A_con.

The second semiconductor device 200 may receive the device control signal A_con. The second semiconductor device 200 may receive/transmit the electrical signal S_tr from/to the first semiconductor device 100 based on the device control signal A_con. For example, the second semiconductor device 200 may output the external transmission signal S_tr to the first semiconductor device 100 based on the device control signal A_con. The second semiconductor device 200 may receive the external transmission signal S_tr from the first semiconductor device 100 based on the device control signal A_con.

The second semiconductor device 200 may include a second transmission circuit 210, a second receiving circuit 220, a second control circuit 230, a margin control circuit 240, a switch 250, and a reference voltage generation circuit 260.

The second transmission circuit 210 may receive a second transmission control signal T_conB and a transmission signal S_t to output the external transmission signal S_tr. For example, when the second transmission control signal T_conB is enabled, the second transmission circuit 210 may be activated. In contrast, when the second transmission control signal T_conB is disabled, the second transmission circuit 210 may be inactivated. When the second transmission circuit 210 is activated by the second transmission control signal T_conB, the second transmission circuit 210 may output the transmission signal S_t as the external transmission signal S_tr.

The second receiving circuit 220 may receive the second receiving control signal R_conB and the external transmission signal S_tr to output the restoration signal S_res. For example, when the second receiving control signal R_conB is enabled, the second receiving circuit 220 may be activated. In contrast, when the second receiving control signal R_conB is disabled, the second receiving circuit 220 may be inactivated. When the second receiving circuit 220 is activated by the second receiving control signal R_conB, the second receiving circuit 220 may output the external transmission signal S_tr as the restoration signal S_res.

The second receiving circuit 220 may include a first amplification circuit 221 and a second amplification circuit 222.

The first amplification circuit 221 may receive the second receiving control signal R_conB and the external transmission signal S_tr to output a positive signal S_p and a negative signal S_n. For example, when the second receiving control signal R_conB is enabled, the first amplification circuit 221 may be activated. In contrast, when the second receiving control signal R_conB is disabled, the first amplification circuit 221 may be inactivated. When the first amplification circuit 221 is activated by the second receiving control signal R_conB, the first amplification circuit 221 may compare a voltage of the external transmission signal S_tr with a reference voltage Vref to output the positive signal S_p and the negative signal S_n. The positive signal S_p and the negative signal S_n may be complementary signals.

The second amplification circuit 222 may receive the positive signal S_p and the negative signal S_n to output the restoration signal S_res. For example, the second amplification circuit 222 may compare voltages of the positive signal S_p and the negative signal S_n with each other to output the restoration signal S_res.

The second control circuit 230 may receive the device control signal A_con to output the second receiving control signal R_conB, the second transmission control signal T_conB, a margin control signal M_con, a selection signal P_c, and a switch control signal S_con. For example, the second control circuit 230 may enable any one of the second receiving control signal R_conB and the second transmission control signal T_conB based on the device control signal A_con to activate any one of the first amplification circuit 221 and the second transmission circuit 210. The second control circuit 230 may output the selection signal P_c and the margin control signal M_con to the margin control circuit 240 based on the device control signal A_con. The second control circuit 230 may output the switch control signal S_con to the switch 250 based on the device control signal A_con. The second control circuit 230 may decode the device control signal A_con to selectively enable the second receiving control signal R_conB, the second transmission control signal T_conB, the margin control signal M_con, the selection signal P_c, and the switch control signal S_con.

The margin control circuit 240 may receive the selection signal P_c and the margin control signal M_con. The margin control circuit 240 may select any one of the positive signal S_p and the negative signal S_n based on the selection signal P_c and the margin control signal M_con. The margin control circuit 240 may decrease a voltage of a selected signal. For example, the margin control circuit 240 may select any one of the positive signal S_p and the negative signal S_n based on the selection signal P_c. The margin control circuit 240 may then decrease the voltage of the selected signal based on the margin control signal M_con.

The switch 250 may receive the switch control signal S_con. The switch 250 may connect and disconnect between an output terminal of the second receiving circuit 220 and an input terminal of the second transmission circuit 210 based on the switch control signal S_con. For example, when the switch control signal S_con is enabled, the switch 250 may connect the output terminal of the second receiving circuit 220 with the input terminal of the second transmission circuit 210. In contrast, when the switch control signal S_con is disabled, the switch 250 may disconnect the output terminal of the second receiving circuit 220 from the input terminal of the second transmission circuit 210. Thus, when the switch control signal S_con is enabled, the restoration signal S_res as the output signal of the second receiving circuit 220 may be inputted into the second transmission circuit 210 as the transmission signal S_t by the switch 250.

Figure 2:
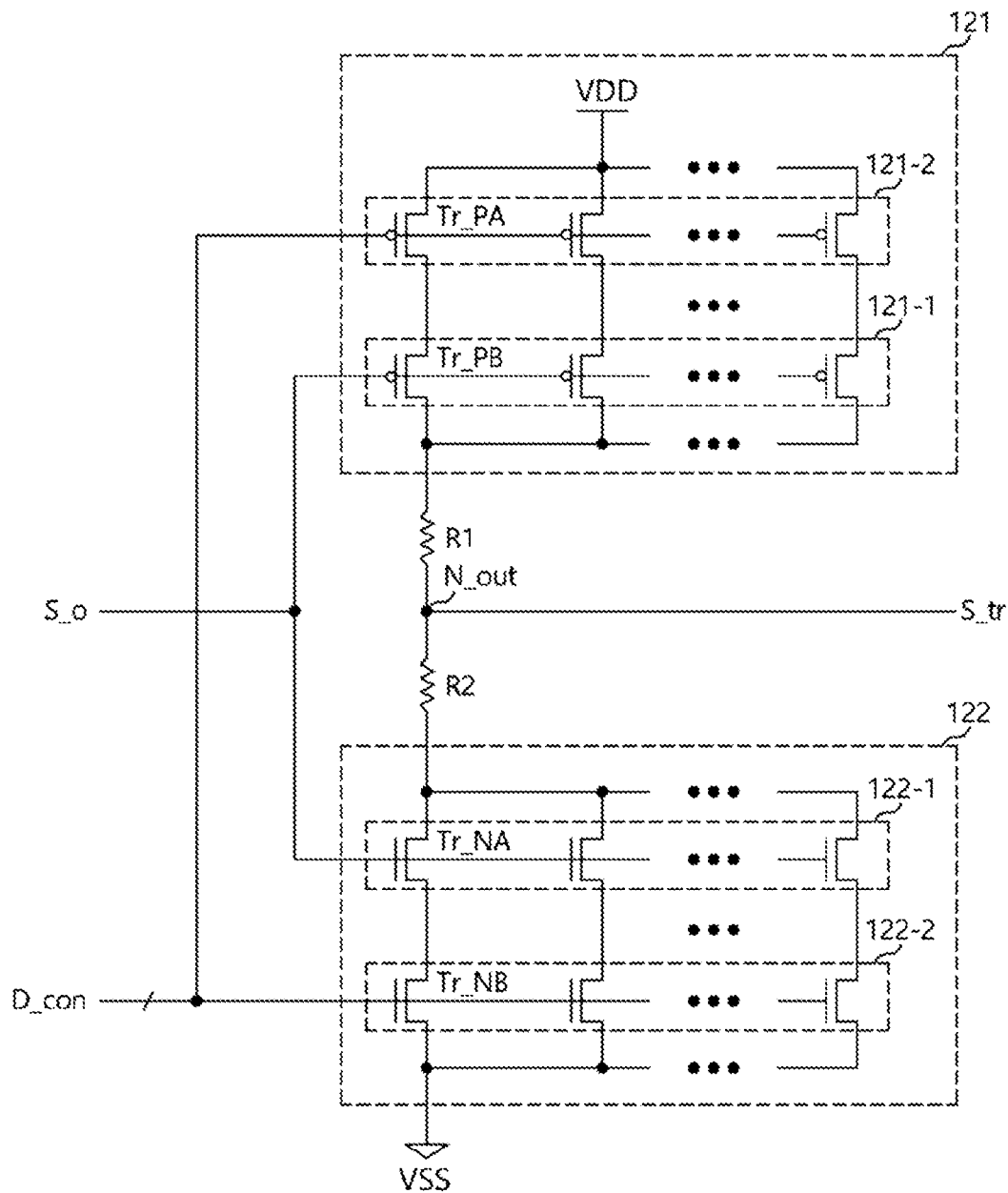
FIG. 2 is a block diagram illustrating a first transmission circuit in FIG. 1.

FIG. 2 is a block diagram illustrating the first transmission circuit 120 in FIG. 1. In FIG. 2, the first transmission circuit 120 may drive the original signal S_o using the driving force in accordance with the driving force control signal D_con to output the external transmission signal S_tr.

Referring to FIG. 2, the first transmission circuit 120 may include a pull-up drive circuit 121, a pull-down drive circuit 122, and first and second resistances R1 and R2.

The pull-up drive circuit 121 may pull-up an output node N_out using a pull-up driving force corresponding to the driving force control signal D_con in accordance with the original signal S_o. For example, when the original signal S_o has a low level, the pull-up drive circuit 121 may increase a voltage level of the output node N_out by the pull-up driving force corresponding to the driving force control signal D_con.

The pull-up drive circuit 121 may include a first input control transistor group 121-1 and a first drive control transistor group 121-2.

The first input control transistor group 121-1 may receive the original signal S_o. The first input control transistor group 121-1 may include a plurality of first transistors Tr_PB that may be turned-on or turned-off based on the original signal S_o. Each of the first transistors Tr_PB may include a gate for receiving the original signal S_o, a source connected to the first drive control transistor group 121-2, and a drain connected to the first resistance R1. The first transistors Tr_PB may include PMOS transistors.

The first drive control transistor group 121-2 may receive the driving force control signal D_con. The first drive control transistor group 121-2 may include a plurality of second transistors Tr_PA that may be turned-on or turned-off based on the driving force control signal D_con. Each of the second transistors Tr_PA may include a gate for receiving the driving force control signal D_con, a source for receiving an external voltage VDD, and a drain connected to the first input control transistor group 121-1. The second transistors Tr_PA may include PMOS transistors.

The pull-down drive circuit 122 may pull-down the output node N_out using a pull-down driving force corresponding to the driving force control signal D_con in accordance with the original signal S_o. For example, when the original signal S_o has a high level, the pull-down drive circuit 122 may increase a voltage level of the output node N_out by the pull-down driving force corresponding to the driving force control signal D_con.

The pull-down drive circuit 122 may include a second input control transistor group 122-1 and a second drive control transistor group 122-2.

The second input control transistor group 122-1 may receive the original signal S_o. The second input control transistor group 122-1 may include a plurality of third transistors Tr_NA that may be turned-on or turned-off based on the original signal S_o. Each of the third transistors Tr_NA may include a gate for receiving the original signal S_o, a source connected to the second drive control transistor group 122-2, and a drain connected to the second resistance R2. The third transistors Tr_NA may include NMOS transistors.

The second drive control transistor group 122-2 may receive the driving force control signal D_con. The second drive control transistor group 122-2 may include a plurality of fourth transistors Tr_NB that may be turned-on or turned-off based on the driving force control signal D_con. Each of the fourth transistors Tr_NB may include a gate for receiving the driving force control signal D_con, a source connected to a ground terminal VSS, and a drain connected to the second input control transistor group 122-1. The fourth transistors Tr_NA may include NMOS transistors.

The first resistance R1 may have one end connected to the pull-up drive circuit 121, i.e., the first input control transistor group 121-1, and the other end connected to the output node N_out.

The second resistance R2 may have one end connected to the output node N_out and the other end connected to the second input control transistor group 121-1. The external transmission signal S_tr may be outputted from the output node N_out.

In some embodiments, the first transmission circuit 120 may drive the original signal S_o using the driving force corresponding to numbers of the transistors, which may be turned-on by the driving force control signal D_con, to output the external transmission signal S_tr.

Figure 3:
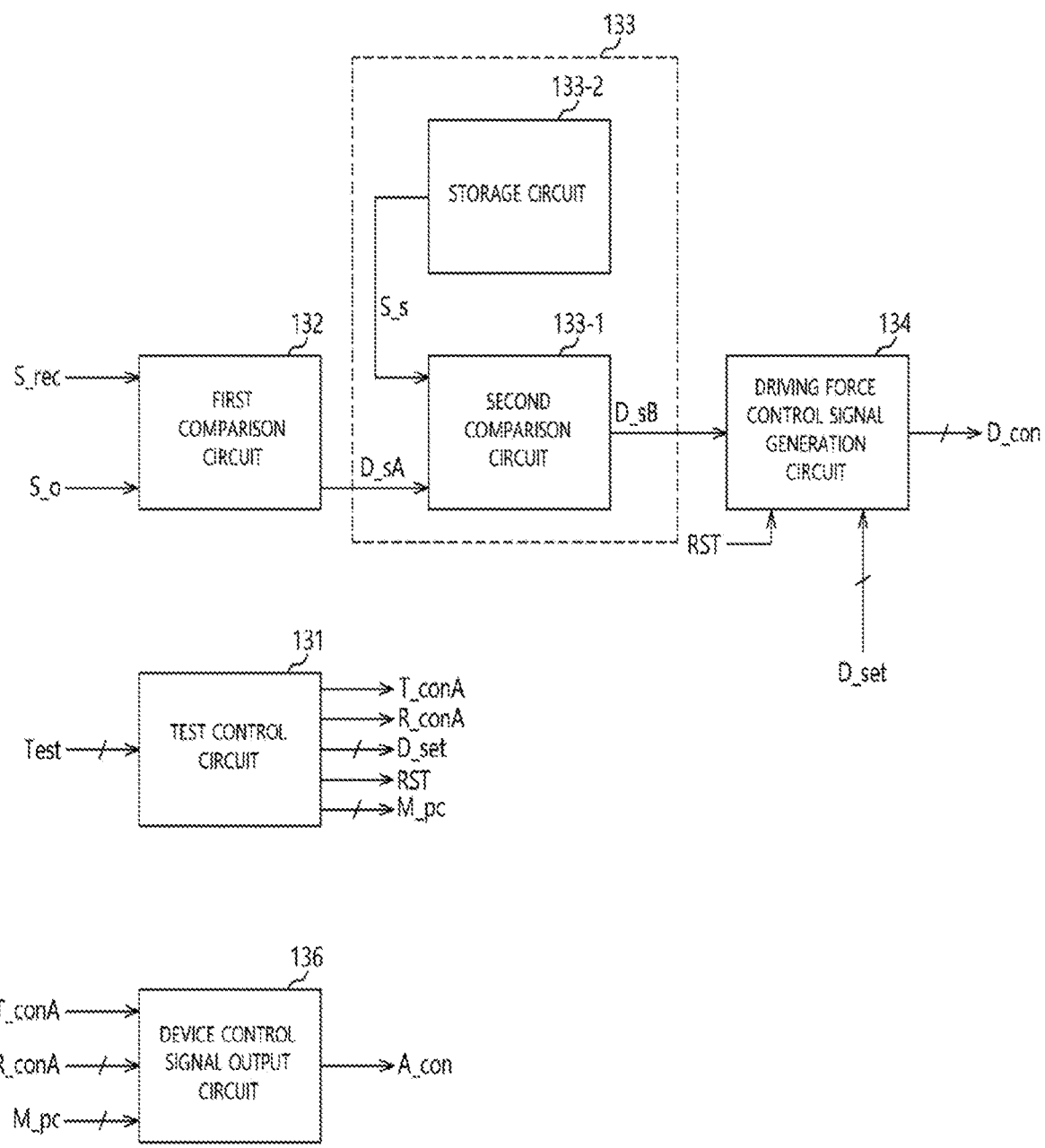
FIG. 3 is a block diagram illustrating a first control circuit in FIG. 1.

FIG. 3 is a block diagram illustrating the first control circuit 130 in FIG. 1.

Referring to FIG. 3, the first control circuit 130 may receive the test signal Test, the receiving signal S_rec, and the original signal S_o to output the first receiving control signal R_conA, the first transmission control signal T_conA, the driving force control signal D_con, and the device control signal A_con. The first control circuit 130 may output the first receiving control signal R_conA, the first transmission control signal T_conA, the driving force control signal D_con, and the device control signal A_con based on the test signal Test. The first control circuit 130 may determine an initial value of the driving force control signal D_con in accordance with the test signal Test. The first control circuit 130 may increase or decrease a value of the driving force control signal D_con in accordance with comparison results between the receiving signal S_rec and the original signal S_o.

The first control circuit 130 may include a test control circuit 131, a first comparison circuit 132, a margin detection circuit 133, a driving force control signal generation circuit 134, and a device control signal output circuit 135.

The test control circuit 131 may receive the test signal Test to output the first transmission control signal T_conA, the first receiving control signal R_conA, a preliminary margin control signal M_pc, a driving force set signal D_set, and a reset signal RST. For example, the test control circuit 131 may enable any one of the first transmission control signal T_conA and the first receiving control signal R_conA based on the test signal Test to activate any one of the first receiving circuit 110 and the first transmission circuit 120. The test control circuit 131 may output the driving force set signal D_set, the preliminary margin control signal M_pc, and the reset signal RST based on the test signal Test. The driving force set signal D_set and the reset signal RST may be inputted into the driving force control signal generation circuit 134. The preliminary margin control signal M_pc may be inputted into the device control signal output circuit 136.

The test control circuit 131 may include a decoding circuit. The test control circuit 131 may decode the test signal Test to generate the first transmission control signal T_conA, the first receiving control signal R_conA, the driving force set signal D_set, the preliminary margin control signal M_pc, and the reset signal RST.

The first comparison circuit 132 may receive the original signal S_o and the receiving signal S_rec to output a first comparison detection signal D_sA. For example, the first comparison circuit 132 may compare a voltage level of the original signal S_o with a voltage level of the receiving signal S_rec to output a comparison result as a voltage level of the first comparison detection signal D_sA.

The margin detection circuit 133 may compare a voltage level of the first comparison detection signal D_sA outputted from the first comparison circuit 132 with a level of a reference voltage to output a second comparison detection signal D_sB.

The margin detection circuit 133 may include a second comparison circuit 133-1 and a storage circuit 133-2.

The second comparison circuit 133-1 may receive the first comparison detection signal D_sA and a reference signal S_s to output the second comparison detection signal D_sB. The reference signal S_s may have a voltage level corresponding to the reference voltage. The second comparison circuit 133-1 may compare the first comparison detection signal D_sA with the reference signal S_s to generate the second comparison detection signal D_sB. For example, the second comparison circuit 133-1 may generate the second comparison detection signal D_sB having a voltage level corresponding to a voltage difference between the first comparison detection signal D_sA and the reference signal S_s.

The storage circuit 133-2 may output the reference signal S_s corresponding to a level of the reference voltage. For example, the storage circuit 133-2 may include a digital-analog converter.

The driving force control signal generation circuit 134 may receive the second comparison detection signal D_sB, the driving force set signal D_set, and the reset signal RST to output the driving force control signal D_con. For example, the driving force control signal generation circuit 134 may generate the driving force control signal D_con having an initial value based on the driving force set signal D_set. The driving force control signal generation circuit 134 may increase a value of the driving force control signal D_con based on a voltage level of the second comparison detection signal D_sB. Alternatively, the driving force control signal generation circuit 134 may decrease the value of the driving force control signal D_con based on the second comparison detection signal D_sB. The driving force control signal generation circuit 134 may reset the increased or decreased driving force control signal D_con to an initial value based on the reset signal RST. The driving force control signal D_con may include a plurality of signals or a plurality of bits of a code.

The device control signal output circuit 136 may receive the first transmission control signal T_conA, the first receiving control signal R_conA, and the preliminary margin control signal M_pc to output the device control signal A_con. For example, the device control signal output circuit 136 may include a transmission circuit for outputting the first transmission control signal T_conA, the first receiving control signal R_conA, and the preliminary margin control signal M_pc as the device control signal A_con. The device control signal output circuit 136 may include a combination of an encoding circuit and a transmission circuit for encoding the first transmission control signal T_conA, the first receiving control signal R_conA, and the preliminary margin control signal M_pc to output the device control signal A_con.

Figure 4:
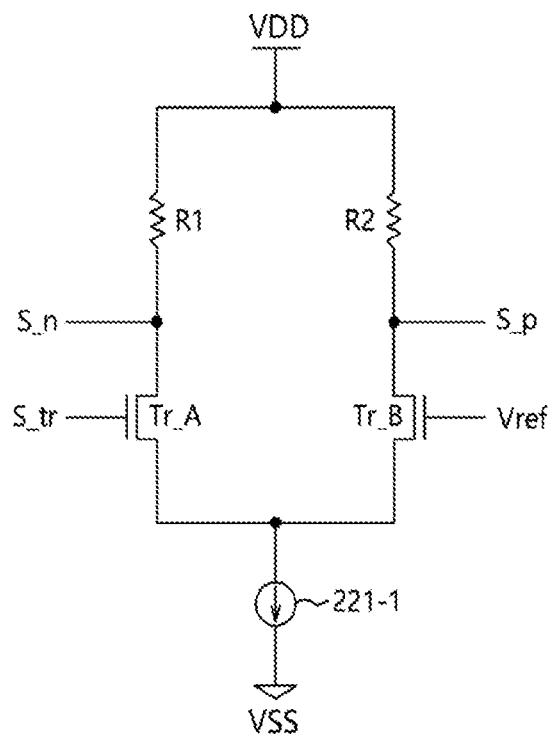
FIG. 4 is a block diagram illustrating a first amplification circuit in FIG. 1.

FIG. 4 is a block diagram illustrating the first amplification circuit 221 in FIG. 1.

Referring to FIG. 4, the first amplification circuit 221 may compare the level of the reference voltage Vref with the voltage level of the external transmission signal S_tr to generate the positive signal S_p and the negative signal S_n.

The first amplification circuit 221 may include first and second resistances R1 and R2, first and second transistors Tr_A and Tr_B, and a current sink circuit 221-1. The first resistance R1 may have one end for receiving the external voltage VDD. The second resistance R2 may have one end for receiving the external voltage VDD. The first transistor Tr_A may include a gate for receiving the external transmission signal S_Tr, and a drain connected to the other end of the first resistance R1. The second transistor Tr_B may include a gate for receiving the reference voltage Vref, and a drain connected to the other end of the second resistance R2. The current sink circuit 221-1 may be connected between a node to which the sources of the first and second transistors Tr_A and Tr_B are commonly connected and the ground terminal VSS. The current sink circuit 221-1 may function as to flow a uniform amount of a current from the node to the ground terminal VSS.

Figure 5:
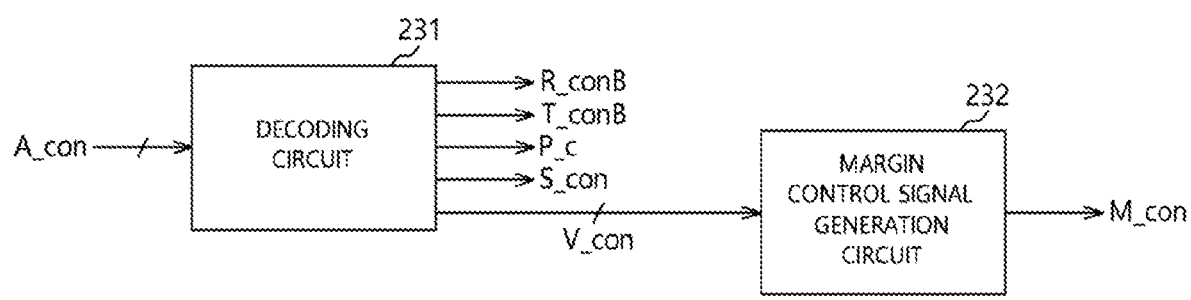
FIG. 5 is a block diagram illustrating a second control circuit in FIG. 1.

FIG. 5 is a block diagram illustrating the second control circuit 230 in FIG. 1.

Referring to FIG. 5, the second control circuit 230 may decode the device control signal A_con to generate the second receiving control signal R_conB, the second transmission control signal T_conB, the selection signal P_c, the margin control signal M_con, and the switch control signal S_con.

The second control circuit 230 may include a decoding circuit 231 and a margin control signal generation circuit 232.

The decoding circuit 231 may decode the device control signal A_con, which may be encoded and inputted by the first semiconductor device 100, to generate the second receiving control signal R_conB, the second transmission control signal T_conB, the selection signal P_c, a voltage control signal V_con, and the switch control signal S_con. The decoding circuit 231 may decode the device control signal A_con to enable any one of the second receiving control signal R_conB and the second transmission control signal T_conB. The decoding circuit 231 may decode the device control signal A_con to enable the switch control signal S_con. The decoding circuit 231 may decode the device control signal A_con to enable or disable the selection signal P_c. The decoding circuit 231 may decode the device control signal A_con to generate the voltage control signal V_con including a plurality of signals or bits of a code and change a value of the voltage control signal V_con.

The margin control signal generation circuit 232 may change a voltage level of the margin control signal M_con based on the voltage control signal V_con. For example, when the voltage control signal V_con is increased, the margin control signal generation circuit 232 may increase the voltage level of the margin control signal M_con. The margin control signal generation circuit 232 may include a digital-analog converter.

Figure 6:
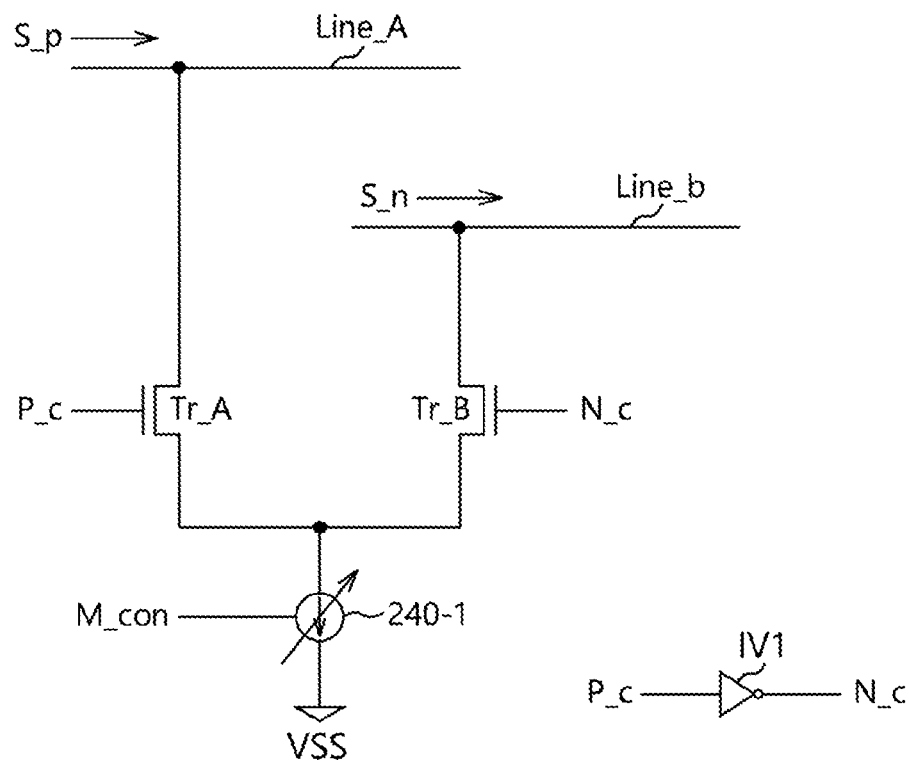
FIG. 6 is a block diagram illustrating a margin control circuit in FIG. 1.

FIG. 6 is a block diagram illustrating the margin control circuit 240 in FIG. 1.

Referring to FIG. 6, the margin control circuit 240 may select any one of the positive signal S_p and the negative signal S_n in accordance with the selection signal P_c. The margin control circuit 240 may decrease a voltage level of a selected signal in accordance with the voltage level of the margin control signal M_con. When the selection signal P_c is enabled, the margin control circuit 240 may select the positive signal S_p. In contrast, when the selection signal P_c is disabled, the margin control circuit 240 may select the negative signal S_n.

The margin control circuit 240 may include first and second transistors Tr_A and Tr_B, an inverter IV1, and a variable current sink circuit 240-1.

The inverter IV1 may receive and invert the selection signal P_c to output an invert selection signal N_c. The first transistor Tr_A may include a drain connected to a first line Line_A through which the positive signal S_p may be transmitted, and a gate for receiving the selection signal P_c. The second transistor Tr_B may include a drain connected to a second line Line_B through which the negative signal S_n may be transmitted, and a gate for receiving the invert selection signal N_c. The variable current sink circuit 240-1 may receive the margin control signal M_con. The variable current sink circuit 240-1 may be connected between a node to which the sources of the first and second transistors Tr_A and Tr_B may be commonly connected and the ground terminal VSS. The variable current sink circuit 240-1 may function as to flow a uniform amount of a current, which may correspond to the voltage level of the margin control signal M_con, from the node to the ground terminal VSS.

Hereinafter, operations of the semiconductor system 50 are described in detail with reference to FIGS. 1 and 7.

The first semiconductor device 100 and the second semiconductor device 200 may perform the initial set operations of a test based on the test signal Test.

The first semiconductor device 100 may initialize the driving force control signal D_con with a set value based on the test signal Test. Thus, a value of the initial driving force of the first transmission circuit 120 to which the driving force control signal D_con may be inputted may be set. The first semiconductor device 100 may encode the signals T_conA, R_conA, and M_pc generated in accordance with the test signal Test to transmit the device control signal A_con to the second semiconductor device 200.

The second semiconductor device 200 may decode the device control signal A_con to determine whether the voltage level of the margin control signal M_con and the selection signal P_c may be enabled or not. The second semiconductor device 200 may select any one of the positive signal S_p and the negative signal P_c outputted from the first amplification circuit 221 in accordance with the selection signal P_c. The second semiconductor device 200 may decrease the voltage level of the selected signal by the voltage level of the margin control signal M_con. Because the voltage level of the margin control signal M_con may be set, the voltage level of the selected one among the positive signal S_p and the negative signal S_n may be decreased by the level of the set voltage.

Therefore, the semiconductor system 50 of example embodiments may set the driving force of the transmission circuit 120 in the first semiconductor device 100 based on the test signal Test. Further, the semiconductor system 50 may set the signal selection of the margin control circuit 240 and the decreased voltage level of the selected signal in the second semiconductor device 200.

After completing the initial set operation of the test, the first semiconductor device 100 may enable the first transmission control signal T_conA based on the test signal Test to activate the first transmission circuit 120.

The activated first transmission circuit 120 may drive the original signal S_o using the set driving force to output the external transmission signal S_tr.

The second semiconductor device 200 may activate the second receiving circuit 220 based on the device control signal A_con.

The first amplification circuit 221 of the activated second receiving circuit 220 may compare the voltage levels of the external transmission signal S_tr and the reference voltage with each other to generate the positive signal S_p and the negative signal S_n. The margin control circuit 240 may select any one of the positive signal S_p and the negative signal S_n. The margin control circuit 240 may decrease the voltage level of the selected signal.

Figure 7:
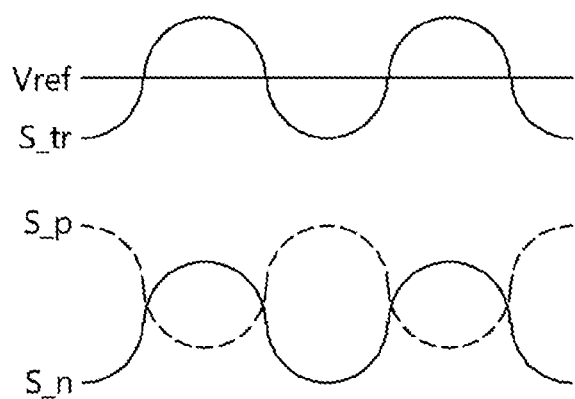
FIG. 7 is a graph showing operations of a semiconductor system, in accordance with an embodiment of the present disclosure.

FIG. 7 is a graph showing operations of the semiconductor system 50 in accordance with some embodiments.

Referring to FIG. 7, for example, the margin control circuit 240 may select the negative signal S_n. The margin control circuit 240 may then decrease the voltage level of the selected negative signal S_n by the set voltage level. The second amplification circuit 222 of the second receiving circuit 220 may compare the voltage levels of the positive signal S_p and the decreased negative signal S_n to generate the restoration signal S_res.

The switch 250 may input the restoration signal S_res into the second transmission circuit 210. The second transmission circuit 210 may transmit the restoration signal S_res provided through the switch 250 as the external transmission signal S_tr to the first semiconductor device 100.

The first receiving circuit 110 of the first semiconductor device 100 may receive the external transmission signal S_tr provided from the second semiconductor device 200 to generate the receiving signal S_rec.

The first control circuit 130 may compare the voltage levels of the original signal S_o and the receiving signal S_rec with each other. The first control circuit 130 may change the value of the driving force control signal D_con in accordance with the comparison result to change the driving force of the first transmission circuit 120.

The first semiconductor device 100 may drive the original signal S_o using the changed driving force to transmit the driven original signal S_o to the second semiconductor device 200.

The second semiconductor device 200 may receive the external transmission signal S_tr driven by the changed driving force. The second semiconductor device 200 may decrease the voltage level of the negative signal S_n among the positive signal S_p and the negative signal S_n generated by the external transmission signal S_tr. The second semiconductor device 200 may generate the restoration signal S_res using the negative signal S_n having the decreased voltage level and the positive signal S_p. The second semiconductor device 200 may output the restoration signal S_res as the external transmission signal S_tr to the first semiconductor device 100.

The first semiconductor device 100 may generate the receiving signal S_rec in accordance with the external transmission signal S_tr. The first semiconductor device 100 may compare the voltage levels of the original signal S_o and the receiving signal S_rec with each other. The first semiconductor device 100 may change or maintain the driving force of the first transmission circuit 120 in accordance with the comparison results.

According to some embodiments, when the external transmission signal S_tr is transmitted from the first semiconductor device to the second semiconductor device, the driving force of the external transmission signal S_tr normally inputted into the second semiconductor device may be tested. Thus, the semiconductor device may be set for transmitting the external transmission signal S_tr using the minimum driving force to reduce a power for transmitting the external transmission signal S_tr.

Figure 8:
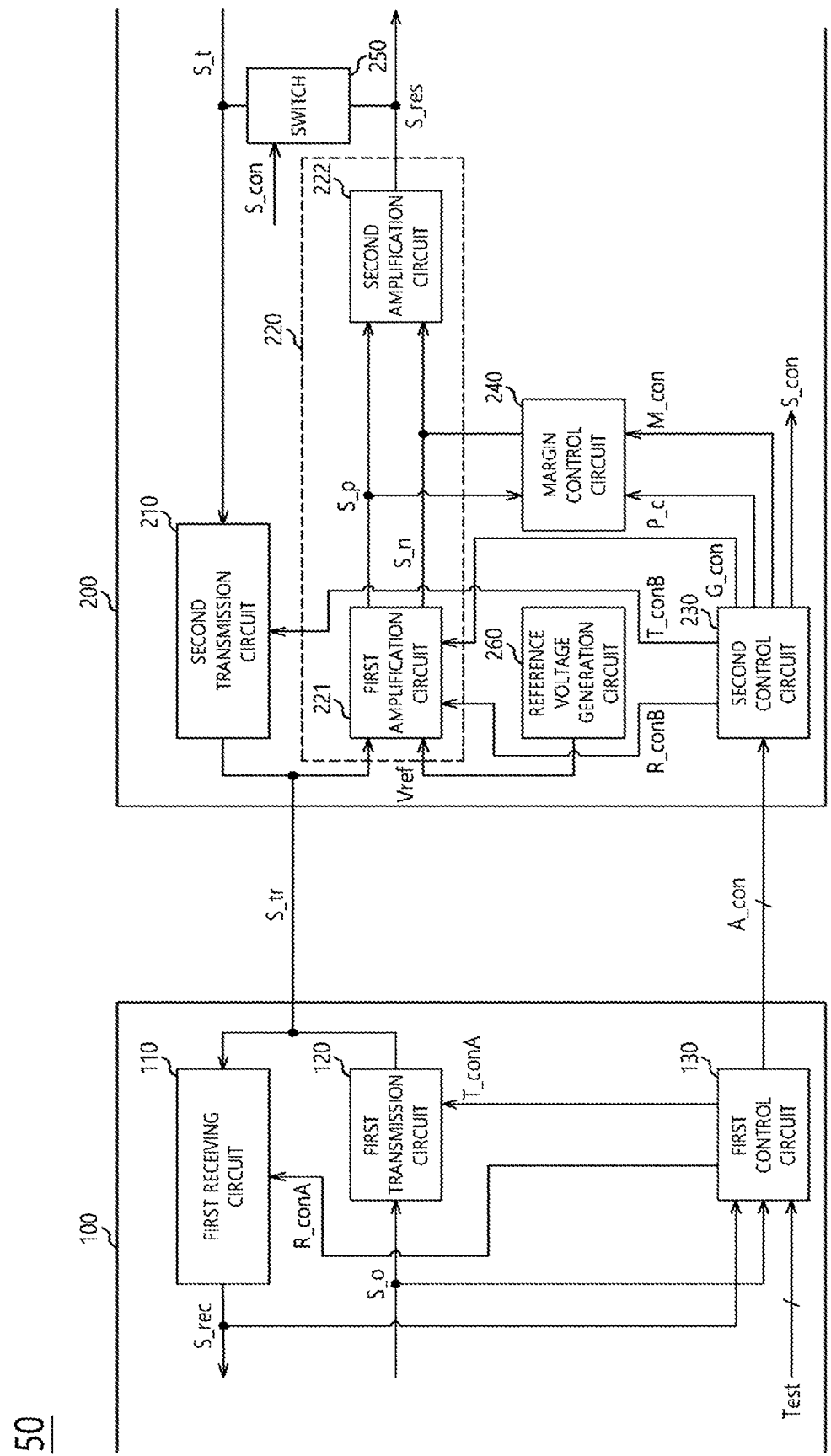
FIG. 8 is a block diagram illustrating a semiconductor system, in accordance with an embodiment of the present disclosure.

FIG. 8 is a block diagram illustrating the semiconductor system 50 in accordance with some embodiments different from those embodiments described with reference to FIG. 1.

The semiconductor system 50 of these embodiments may determine a minimum gain of the receiving circuit in the second semiconductor device 200 without changing the driving force for driving the signal transmitted by the first semiconductor device 100.

Referring to FIG. 8, the first semiconductor device 100 may include a first receiving circuit 110, a first transmission circuit 120, and a first control circuit 130.

The first receiving circuit 110 may receive a first receiving control signal R_conA and the external transmission signal S_tr to output a receiving signal S_rec. When the first receiving control signal R_conA is enabled, the first receiving circuit 110 may generate and output the receiving signal S_rec based on the external transmission signal S_tr. For example, when the first receiving control signal R_conA is enabled, the first receiving circuit 110 may be activated. The activated first receiving circuit 110 may receive the external transmission signal S_tr to output the receiving signal S_rec. When the first receiving control signal R_conA is disabled, the first receiving circuit 110 may be inactivated.

The first transmission circuit 120 may receive a first transmission control signal T_conA and an original signal S_o to output the external transmission signal S_tr. For example, when the first transmission control signal T_conA is enabled, the first transmission circuit 120 may be activated. The first transmission circuit 120 may drive the original signal S_o to output the external transmission signal S_tr. In contrast, when the first transmission control signal T_conA is disabled, the first transmission circuit 120 may be inactivated.

The first control circuit 130 may receive the original signal S_o, the receiving signal S_rec, and the test signal Test to output the first transmission control signal T_conA, the first receiving control signal R_conA, and a device control signal A_con. For example, the first control circuit 130 may enable and output any one of the first transmission control signal T_conA and the first receiving control signal R_conA based on the test signal Test to activate any one of the first receiving circuit 110 and the first transmission circuit 120. The first control circuit 130 may compare the original signal S_o with the receiving signal S_rec to output the driving force control signal D_con. The first control circuit 130 may encode comparison information of the original signal S_o and the receiving signal S_rec, the first transmission control signal T_conA, the first receiving control signal R_conA, and the test signal Test to output the device control signal A_con.

The second semiconductor device 200 may receive/transmit the electrical signal S_tr from/to the first semiconductor device 100 based on the device control signal A_con. For example, the second semiconductor device 200 may output the external transmission signal S_tr to the first semiconductor device 100 based on the device control signal A_con. The second semiconductor device 200 may receive the external transmission signal S_tr from the first semiconductor device 100 based on the device control signal A_con.

The second semiconductor device 200 may include a second transmission circuit 210, a second receiving circuit 220, a second control circuit 230, a margin control circuit 240, a switch 250 and a reference voltage generation circuit 260.

The second transmission circuit 210 may receive a second transmission control signal T_conB and a transmission signal S_t to output the external transmission signal S_tr. For example, when the second transmission control signal T_conB is enabled, the second transmission circuit 210 may be activated to output the transmission signal S_t as the external transmission signal S_tr. In contrast, when the second transmission control signal T_conB is disabled, the second transmission circuit 210 may be inactivated.

The second receiving circuit 220 may receive the second receiving control signal R_conB and the external transmission signal S_tr to output the restoration signal S_res. For example, when the second receiving control signal R_conB is enabled, the second receiving circuit 220 may be activated. The activated second receiving circuit 220 may receive the external transmission signal S_tr to output the restoration signal S_res. In contrast, when the second receiving control signal R_conB is disabled, the second receiving circuit 220 may be inactivated.

The second receiving circuit 220 may include a first amplification circuit 221 and a second amplification circuit 222.

The first amplification circuit 221 may receive the second receiving control signal R_conB, a gain control signal G_con and the external transmission signal S_tr to output a positive signal S_p and a negative signal S_n. For example, when the second receiving control signal R_conB is enabled, the first amplification circuit 221 may be activated. The activated first amplification circuit 221 may compare a voltage of the external transmission signal S_tr with the reference voltage Vref to output the positive signal S_p and the negative signal S_n. An amplification gain of the first amplification circuit 221 may be set based on the gain control signal G_con. For example, the first amplification circuit 221 may increase a voltage difference between the positive signal S_p and the negative signal S_n, which may be generated based on the level difference between the external transmission signal S_tr and the reference voltage Vref, in proportion to increasing of the set amplification gain value. When the set amplification gain value is increased from 1 to 2, the first amplification circuit 221 may increase the voltage difference between the positive signal S_p and the negative signal S_n, which may be generated based on the level difference between the external transmission signal S_tr and the reference voltage Vref, from 1 to 2. The positive signal S_p and the negative signal S_n may be complementary signals.

The second amplification circuit 222 may receive the positive signal S_p and the negative signal S_n to output the restoration signal S_res. For example, the second amplification circuit 222 may compare voltages of the positive signal S_p and the negative signal S_n with each other to output the restoration signal S_res.

The second control circuit 230 may receive the device control signal A_con to output the second receiving control signal R_conB, the second transmission control signal T_conB, a margin control signal M_con, a selection signal P_c, the gain control signal G_con, and a switch control signal S_con. For example, the second control circuit 230 may enable any one of the second receiving control signal R_conB and the second transmission control signal T_conB based on the device control signal A_con to activate any one of the first amplification circuit 221 and the second transmission circuit 210. The second control circuit 230 may generate the selection signal P_c, the gain control signal G_con, and the margin control signal M_con based on the device control signal A_con. The second control circuit 230 may include a decoding circuit. The second control circuit 230 may decode the device control signal A_con to generate the second receiving control signal R_conB, the second transmission control signal T_conB, the margin control signal M_con, the selection signal P_c, the gain control signal G_con, and the switch control signal S_con.

The margin control circuit 240 may receive the selection signal P_c and the margin control signal M_con. The margin control circuit 240 may select any one of the positive signal S_p and the negative signal S_n based on the selection signal P_c and the margin control signal M_con. The margin control circuit 240 may decrease a voltage of a selected signal. For example, the margin control circuit 240 may select any one of the positive signal S_p and the negative signal S_n based on the selection signal P_c. The margin control circuit 240 may then decrease the voltage of the selected signal based on the margin control signal M_con.

The switch 250 may receive the switch control signal S_con. The switch 250 may connect and disconnect between an output terminal of the second receiving circuit 220 and an input terminal of the second transmission circuit 210 based on the switch control signal S_con. For example, when the switch control signal S_con is enabled, the switch 250 may connect the output terminal of the second receiving circuit 220 with the input terminal of the second transmission circuit 210. In contrast, when the switch control signal S_con is disabled, the switch 250 may disconnect the output terminal of the second receiving circuit 220 from the input terminal of the second transmission circuit 210. Thus, when the switch control signal S_con is enabled, the restoration signal S_res as the output signal of the second receiving circuit 220 may be inputted into the second transmission circuit 210 as the transmission signal S_t by the switch 250.

The first semiconductor device 100 and the second semiconductor device 200 in FIG. 8 may include elements substantially the same as those of the first semiconductor device 100 and the second semiconductor device 200 in FIG. 1 except for the first control circuit 130, the second control circuit 230, and the first amplification circuit 221. Thus, the same reference numerals may refer to the same elements and any further illustrations with respect to the same elements may be omitted herein for brevity.

Figure 9:
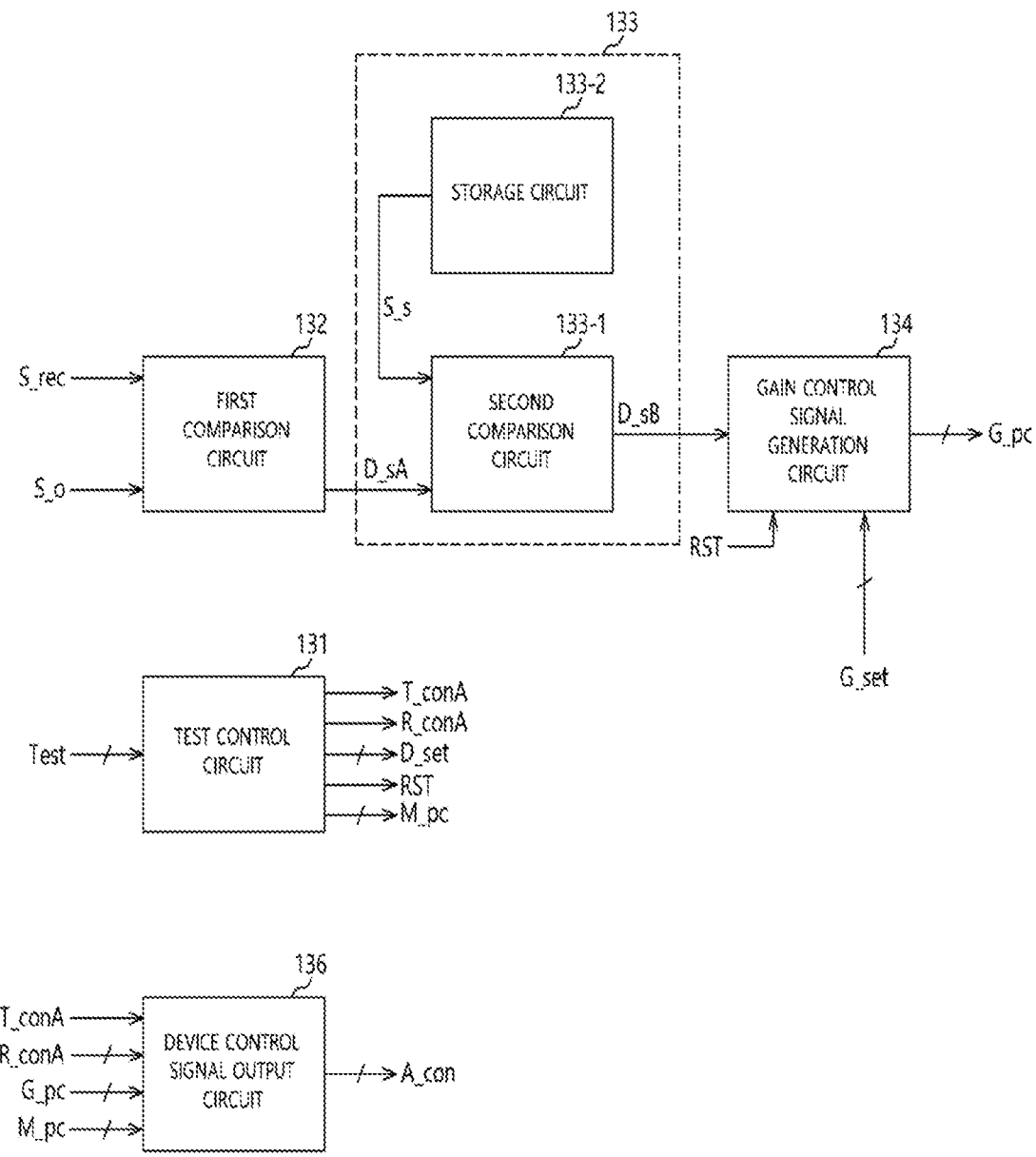
FIG. 9 is a block diagram illustrating a first control circuit in FIG. 8.

FIG. 9 is a block diagram illustrating the first control circuit 130 in FIG. 8.

Referring to FIG. 9, the first control circuit 130 may include a test control circuit 131, a first comparison circuit 132, a margin detection circuit 133, a gain control signal generation circuit 134, and a device control signal output circuit 135.

The test control circuit 131 may receive the test signal Test to output the first transmission control signal T_conA, the first receiving control signal R_conA, a preliminary margin control signal M_pc, a gain set signal G_set, and a reset signal RST. For example, the test control circuit 131 may enable any one of the first transmission control signal T_conA and the first receiving control signal R_conA based on the test signal Test. The test control circuit 131 may decode the test signal Test to generate the gain set signal G_set, the preliminary margin control signal M_pc, and the reset signal RST. The test control circuit 131 may include a decoding circuit.

The first comparison circuit 132 may receive the original signal S_o and the receiving signal S_rec to output a first comparison detection signal D_sA. For example, the first comparison circuit 132 may compare a voltage level of the original signal S_o with a voltage level of the receiving signal S_rec to output a comparison result as a voltage level of the first comparison detection signal D_sA.

The margin detection circuit 133 may compare a voltage level of the first comparison detection signal D_sA with a level of a reference voltage to output a second comparison detection signal D_sB. For example, the margin detection circuit 133 may generate the second comparison detection signal D_sB having a voltage level corresponding to the voltage level difference between the first comparison detection signal D_sA and the reference voltage Vref.

The margin detection circuit 133 may include a second comparison circuit 133-1 and a storage circuit 133-2.

The second comparison circuit 133-1 may receive the first comparison detection signal D_sA and a reference signal S_s corresponding to the level of the reference voltage Vref to output the second comparison detection signal D_sB. The second comparison circuit 133-1 may compare the first comparison detection signal D_sA with the reference signal S_s to generate the second comparison detection signal D_sB. For example, the second comparison circuit 133-1 may generate the second comparison detection signal D_sB having a voltage level corresponding to a voltage difference between the first comparison detection signal D_sA and the reference signal S_s.

The storage circuit 133-2 may output the reference signal S_s corresponding to a level of the reference voltage. For example, the storage circuit 133-2 may include a digital-analog converter.

The gain control signal generation circuit 134 may receive the second comparison detection signal D_sB, the gain set signal G_set, and the reset signal RST to output a preliminary gain control signal G_pc. For example, the gain control signal generation circuit 134 may generate the preliminary gain control signal G_pc having an initial value based on the gain set signal G_set. The gain control signal generation circuit 134 may increase a value of the preliminary gain control signal G_pc based on a voltage level of the second comparison detection signal D_sB. Alternatively, the gain control signal generation circuit 134 may decrease the value of the preliminary gain control signal G_pc based on the second comparison detection signal D_sB. The gain control signal generation circuit 134 may reset the increased or decreased preliminary gain control signal G_pc to an initial value based on the reset signal RST. The preliminary gain control signal G_pc may include a plurality of signals or a plurality of bits of a code.

The device control signal output circuit 136 may receive the first transmission control signal T_conA, the first receiving control signal R_conA, the preliminary margin control signal M_pc, and the preliminary gain control signal G_pc to output the device control signal A_con. For example, the device control signal output circuit 136 may include a transmission circuit for outputting the first transmission control signal T_conA, the first receiving control signal R_conA, the preliminary margin control signal M_pc, and the preliminary gain control signal G_pc as the device control signal A_con. The device control signal output circuit 136 may include a combination of an encoding circuit and a transmission circuit for encoding the first transmission control signal T_conA, the first receiving control signal R_conA, the preliminary margin control signal M_pc, and the preliminary gain control signal G_pc to output the device control signal A_con.

Figure 10:
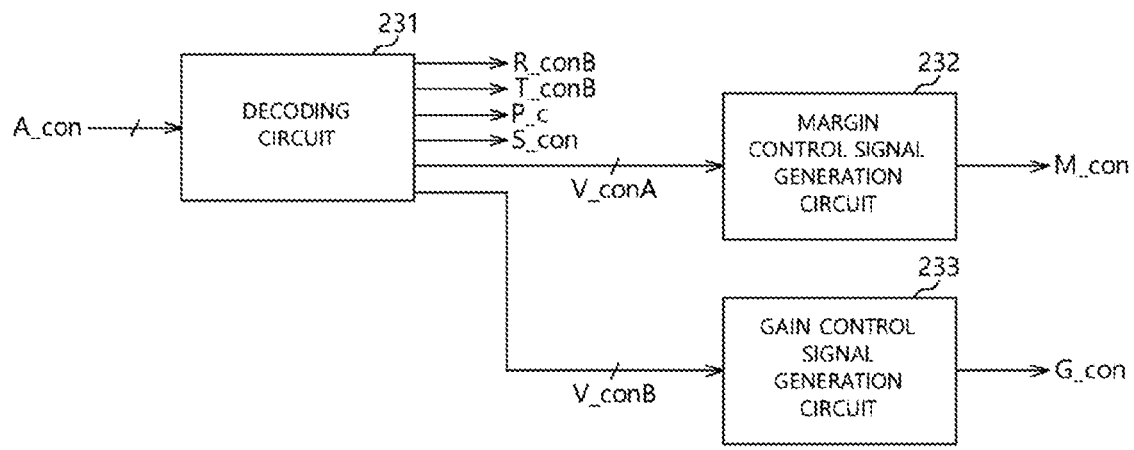
FIG. 10 is a block diagram illustrating a second control circuit in FIG. 8.

FIG. 10 is a block diagram illustrating the second control circuit 230 in FIG. 8.

Referring to FIG. 10, the second control circuit 230 may include a decoding circuit 231, a margin control signal generation circuit 232, and a gain control signal generation circuit 233.

The decoding circuit 231 may decode the device control signal A_con, which may be encoded and inputted by the first semiconductor device 100, to generate the second receiving control signal R_conB, the second transmission control signal T_conB, the selection signal P_c, a first voltage control signal V_conA, a second voltage control signal V_conB, and the switch control signal S_con. The decoding circuit 231 may decode the device control signal A_con to enable any one of the second receiving control signal R_conB and the second transmission control signal T_conB. The decoding circuit 231 may decode the device control signal A_con to enable the switch control signal S_con. The decoding circuit 231 may decode the device control signal A_con to enable or disable the selection signal P_c. The decoding circuit 231 may decode the device control signal A_con to generate the first and second voltage control signals V_conA and V_conB including a plurality of signals or bits of a code and change values of the first and second voltage control signals V_conA and V_conB.

The margin control signal generation circuit 232 may change a voltage level of the margin control signal M_con based on the first voltage control signal V_conA. For example, when the first voltage control signal V_conA is increased, the margin control signal generation circuit 232 may increase the voltage level of the margin control signal M_con. The margin control signal generation circuit 232 may include a digital-analog converter.

The gain control signal generation circuit 233 may change the voltage level of the gain control signal G_con based on the second voltage control signal V_conB. For example, when the second voltage control signal V_conB is increased, the gain control signal generation circuit 233 may increase the voltage level of the margin control signal M_con. The gain control signal generation circuit 233 may include a digital-analog converter.

Figure 11:
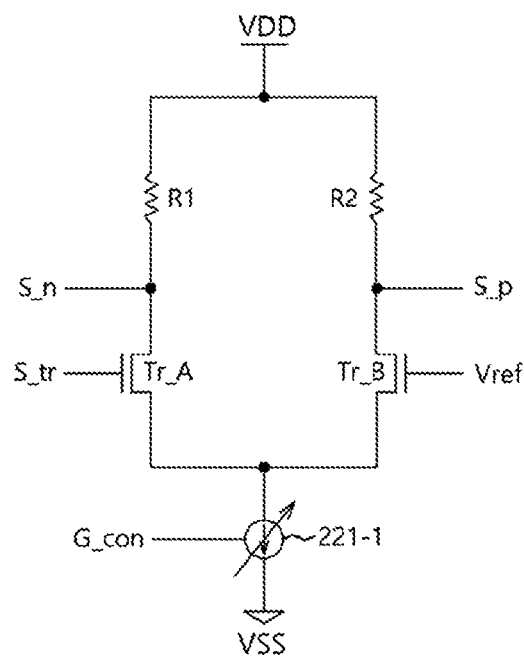
FIG. 11 is a block diagram illustrating a first amplification circuit in FIG. 8.

FIG. 11 is a block diagram illustrating the first amplification circuit 221 in FIG. 8.

Referring to FIG. 11, the first amplification circuit 221 may include first and second resistances R1 and R2, first and second transistors Tr_A and Tr_B, and a current sink circuit 221-1. The first resistance R1 may have one end for receiving the external voltage VDD. The second resistance R2 may have one end for receiving the external voltage VDD. The first transistor Tr_A may include a gate for receiving the external transmission signal S_Tr, and a drain connected to the other end of the first resistance R1. The second transistor Tr_B may include a gate for receiving the reference voltage Vref, and a drain connected to the other end of the second resistance R2. The current sink circuit 221-1 may be connected between a node to which the sources of the first and second transistors Tr_A and Tr_B may be commonly connected and the ground terminal VSS to receive the gain control signal G_con. The current sink circuit 221-1 may function to allow a uniform amount of a current to flow from the node to the ground terminal VSS.

Hereinafter, operations of the semiconductor system 50 are described in detail with reference to FIGS. 7 and 8.

The first semiconductor device 100 and the second semiconductor device 200 may perform the initial set operations of a test based on the test signal Test.

The first semiconductor device 100 may generate the preliminary margin signal M_pc and the preliminary gain signal G_pc based on the test signal Test. The first semiconductor device 100 may then encode and transmit the preliminary margin signal M_pc and the preliminary gain signal G-pc to the second semiconductor device 200. The preliminary gain signal G_pc having an initial value may be generated by the gain set signal G_set generated in accordance with the test signal Test.

The second semiconductor device 200 may decode the device control signal A_con to determine whether the voltage level of the margin control signal M_con and the selection signal P_c may be enabled or not. Further, the second semiconductor device 200 may generate the gain control signal G_con having an initial value based on the preliminary gain signal G_pc having the initial value. The second semiconductor device 200 may select any one of the positive signal S_p and the negative signal P_c outputted from the first amplification circuit 221 in accordance with the selection signal P_c. The second semiconductor device 200 may decrease the voltage level of the selected signal by the voltage level of the margin control signal M_con. Because the voltage level of the margin control signal M_con may be set, the voltage level of the selected one among the positive signal S_p and the negative signal S_n may be decreased by the level of the set voltage.

Therefore, the semiconductor system 50 of example embodiments may set the gain of the second receiving circuit 220 in the second semiconductor device 200 based on the test signal Test. Further, the semiconductor system 50 may set the signal selection of the margin control circuit 240 and the decreased voltage level of the selected signal in the second semiconductor device 200.

After completing the initial set operation of the test, the first semiconductor device 100 may enable the first transmission control signal T_conA based on the test signal Test to activate the first transmission circuit 120.

The activated first transmission circuit 120 may drive the original signal S_o using the set driving force to output the external transmission signal S_tr.

The second semiconductor device 200 may activate the second receiving circuit 220 based on the device control signal A_con.

The first amplification circuit 221 of the activated second receiving circuit 220 may compare the voltage levels of the external transmission signal S_tr and the reference voltage with each other based on the gain in accordance with the gain control signal G_con having the initial value to generate the positive signal S_p and the negative signal S_n. The margin control circuit 240 may select any one of the positive signal S_p and the negative signal S_n. The margin control circuit 240 may decrease the voltage level of the selected signal.

Referring to FIG. 7, for example, the margin control circuit 240 may select the negative signal S_n. The margin control circuit 240 may then decrease the voltage level of the selected negative signal S_n by the set voltage level. The second amplification circuit 222 of the second receiving circuit 220 may compare the voltage levels of the positive signal S_p and the decreased negative signal S_n to generate the restoration signal S_res.

The switch 250 may input the restoration signal S_res into the second transmission circuit 210. The second transmission circuit 210 may transmit the restoration signal S_res provided through the switch 250 as the external transmission signal S_tr to the first semiconductor device 100.

The first receiving circuit 110 of the first semiconductor device 100 may receive the external transmission signal S_tr provided from the second semiconductor device 200 to generate the receiving signal S_rec.

The first control circuit 130 may compare the voltage levels of the original signal S_o and the receiving signal S_rec with each other. The first control circuit 130 may change the value of the preliminary gain control signal G_con in accordance with the comparison result.

The first semiconductor device 100 may encode the preliminary gain control signal G_pc having the changed value. The first semiconductor device 100 may then transmit the encoded preliminary gain control signal G_pc to the second semiconductor device 200.

The second semiconductor device 200 may change the gain control signal G_con based on the preliminary gain control signal G_pc. The second semiconductor device 200 may generate the positive signal S_p and the negative signal S_n using the gain in accordance with the gain control signal G_con based on the external transmission signal S_tr. The margin control circuit 240 of the second semiconductor device 200 may decrease the voltage level of the negative signal S_n among the positive signal S_p and the negative signal S_n. The second semiconductor device 200 may generate the restoration signal S_res using the negative signal S_n having the decreased voltage level and the positive signal S_p. The second semiconductor device 200 may output the restoration signal S_res as the external transmission signal S_tr to the first semiconductor device 100.

The first semiconductor device 100 may generate the receiving signal S_rec in accordance with the external transmission signal S_tr. The first semiconductor device 100 may compare the voltage levels of the original signal S_o and the receiving signal S_rec with each other. The first semiconductor device 100 may change or maintain the gain of the first amplification circuit 221 of the second semiconductor device 200 in accordance with the comparison results.

According to some embodiments, when the external transmission signal S_tr is transmitted from the first semiconductor device to the second semiconductor device, the gain of the external transmission signal S_tr normally inputted into the second semiconductor device may be tested. Thus, the semiconductor device may be set for transmitting the external transmission signal S_tr using the minimum gain to reduce a power for transmitting the external transmission signal S_tr.

The embodiments described above for the present disclosure are intended to illustrate and not to limit the present teachings. Various alternatives and equivalents are possible. The present teachings are not limited by the embodiments described herein. Nor are the present teachings limited to any specific type of semiconductor device. Other additions, subtractions, or modifications are possible in view of the present disclosure and are intended to fall within the scope of the appended claims.

What is claimed is:

1. A semiconductor system comprising:
a first semiconductor device configured to:
    compare an original signal with a receiving signal to generate a driving force control signal; and
    drive the original signal using a driving force in accordance with the driving force control signal to output an external transmission signal; and a second semiconductor device configured to:
receive the external transmission signal to generate a positive signal and a negative signal;
generate a restoration signal based on the positive signal and the negative signal; and
output the restoration signal as the external transmission signal to the first semiconductor device.

2. The semiconductor system of claim 1, wherein the first semiconductor device comprises:
a transmission circuit configured to drive the original signal using the driving force in accordance with the driving force control signal to output the external transmission signal;
a receiving circuit configured to receive the external transmission signal from the second semiconductor device to generate the receiving signal; and
a control circuit configured to compare the original signal with the receiving signal to generate the driving force control signal.

3. The semiconductor system of claim 2, wherein the control circuit comprises:
a first comparison circuit configured to compare the original signal with the receiving signal to generate a first comparison detection signal;
a second comparison circuit configured to compare the first comparison detection signal with a reference signal to generate a second comparison detection signal; and
a driving force control signal generation circuit configured to generate the driving force control signal based on the second comparison detection signal.

4. The semiconductor system of claim 3, wherein the control circuit further comprises a test control circuit configured to generate a driving force set signal based on the test signal.

5. The semiconductor system of claim 4, wherein the driving force control signal generation circuit is configured to:
determine an initial value of the driving force control signal in response to the driving force set signal; and
change the driving force control signal with an initial value based on the second comparison detection signal.

6. The semiconductor system of claim 1, wherein the second semiconductor device comprises:
a first amplification circuit configured to receive the external transmission signal to generate the positive signal and the negative signal;
a margin control circuit configured to decrease a voltage of any one of the positive signal and the negative signal by a set voltage level;
a second amplification circuit configured to generate the restoration signal based on the positive signal and the negative signal, wherein one of the positive signal and the negative signal has the decreased voltage; and
a transmission circuit configured to output the restoration signal as the external transmission signal to the first semiconductor device.

7. The semiconductor system of claim 1, wherein the second semiconductor device comprises:
a first amplification circuit configured to compare voltage levels of the external transmission signal and a reference voltage with each other to generate the positive signal and the negative signal;
a margin control circuit configured to select any one of the positive signal and the negative signal based on a selection signal and a margin control signal and configured to decrease a voltage of a selected one of the positive signal and the negative signal;
a second amplification circuit for generating the restoration signal based on the positive signal and the negative signal, wherein one of the positive signal and the negative signal has the decreased voltage;
a switch configured to output the restoration signal as a transmission signal based on a switch control signal;
a transmission circuit configured to output the transmission signal as the external transmission signal to the first semiconductor device;
a reference voltage generation circuit configured to provide the first amplification circuit with the reference voltage; and
a second control circuit configured to generate the switch control signal, the selection signal, and the margin control signal.

8. A semiconductor system comprising:
a first semiconductor device configured to:
compare an original signal with a receiving signal to generate a preliminary gain control signal;
output the original signal as an external transmission signal; and
output the preliminary gain control signal as a device control signal; and
a second semiconductor device configured to:
amplifying the external transmission signal using a gain in accordance with the device control signal to generate a positive signal and a negative signal; and
generate a restoration signal based on the positive signal and the negative signal to output the restoration signal as the external transmission signal to the first semiconductor device.

9. The semiconductor system of claim 8, wherein the first semiconductor device comprises:
a transmission circuit configured to drive the original signal to output the external transmission signal;
a receiving circuit configured to receive the external transmission signal from the second semiconductor device to generate the receiving signal;
a control circuit configured to compare the original signal with the receiving signal to generate the preliminary gain control signal; and
a device control signal output circuit configured to output the preliminary gain control signal as the device control signal to the second semiconductor device.

10. The semiconductor system of claim 9, wherein the control circuit comprises:
a first comparison circuit configured to compare the original signal with the receiving signal to generate a first comparison detection signal;
a second comparison circuit configured to compare the first comparison detection signal with a reference signal to generate a second comparison detection signal; and
a gain control signal generation circuit configured to generate the preliminary gain control signal based on the second comparison detection signal.

11. The semiconductor system of claim 10, wherein the control circuit further comprises a test control circuit configured to generate a gain set signal based on the test signal.

12. The semiconductor system of claim 11, wherein the gain control signal generation circuit is configured to:
determine an initial value of the preliminary gain control signal in response to the gain set signal; and
change the preliminary gain control signal with an initial value based on the second comparison detection signal.

13. The semiconductor system of claim 8, wherein the second semiconductor device comprises:

a first amplification circuit configured to receive the external transmission signal to generate the positive signal and the negative signal using a gain in accordance with the device control signal;

a margin control circuit configured to decrease a voltage of any one of the positive signal and the negative signal by a set voltage level;

a second amplification circuit configured to generate the restoration signal based on the positive signal and the negative signal, wherein one of the positive signal and the negative signal has the decreased voltage; and a transmission circuit configured to output the restoration signal as the external transmission signal to the first semiconductor device.

14. The semiconductor system of claim 8, wherein the second semiconductor device comprises:

a first amplification circuit configured to compare voltage levels of the external transmission signal and a reference voltage with each other and configured to amplify a comparison result using a gain in accordance with a gain control signal to generate the positive signal and the negative signal;

a margin control circuit configured to select any one of the positive signal and the negative signal based on a selection signal and a margin control signal and configured to decrease a voltage of a selected one of the positive signal and the negative signal;

a second amplification circuit for generating the restoration signal based on the positive signal and the negative signal, wherein one of the positive signal and the negative signal has the decreased voltage;

a switch configured to output the restoration signal as a transmission signal based on a switch control signal;

a transmission circuit configured to output the transmission signal as the external transmission signal to the first semiconductor device;

a reference voltage generation circuit configured to provide the first amplification circuit with the reference voltage; and a second control circuit configured to generate the switch control signal, the selection signal, the margin control signal and the gain control signal based on the device control signal.

* * * * *